(12) United States Patent
Jin et al.

(10) Patent No.: US 8,742,859 B2
(45) Date of Patent: Jun. 3, 2014

(54) TUNABLE INDUCTOR CIRCUIT

(75) Inventors: Zhang Jin, San Diego, CA (US); Li Liu, San Diego, CA (US); Chiewcham Narathong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 77 days.

(21) Appl. No.: 13/312,177

(22) Filed: Dec. 6, 2011

(65) Prior Publication Data

US 2013/0141177 A1 Jun. 6, 2013

(51) Int. Cl.
*H03B 5/12* (2006.01)
*H01F 21/12* (2006.01)
*H01F 27/28* (2006.01)

(52) U.S. Cl.
CPC ............ *H03B 5/1268* (2013.01); *H03B 5/1228* (2013.01); *H03B 2200/0034* (2013.01); *H03B 2201/0266* (2013.01); *H01F 2021/125* (2013.01); *H01F 21/12* (2013.01); *H01F 27/2804* (2013.01)
USPC .................... 331/117 FE; 331/167; 331/181; 336/200; 336/232

(58) Field of Classification Search
CPC . H01F 17/0006; H01F 21/12; H01F 27/2804; H01F 27/29; H01F 2017/0006; H01F 2021/12; H01F 2021/125
USPC .......... 331/117 FE, 36 L, 177 V, 117 R, 167, 331/177 R, 179, 181; 327/427; 336/232, 336/200
See application file for complete search history.

(56) References Cited

U.S. PATENT DOCUMENTS

| | | | | |
|---|---|---|---|---|
| 6,410,955 | B1 * | 6/2002 | Baker et al. | 257/307 |
| 7,312,685 | B1 * | 12/2007 | Lee et al. | 336/200 |
| 7,551,035 | B2 * | 6/2009 | Westra et al. | 330/311 |
| 7,554,416 | B2 * | 6/2009 | Lee et al. | 331/115 |
| 2007/0052512 | A1 * | 3/2007 | Jeon et al. | 336/200 |
| 2007/0257735 | A1 * | 11/2007 | Chan et al. | 331/16 |
| 2009/0102572 | A1 | 4/2009 | Eo et al. | |
| 2009/0201100 | A1 * | 8/2009 | Kossel et al. | 333/138 |
| 2011/0051308 | A1 | 3/2011 | Chan | |
| 2012/0286889 | A1 * | 11/2012 | Park et al. | 331/117 FE |

OTHER PUBLICATIONS

Kossel, et al., "LC PLL With 1.2-Octave Locking Range Based on Mutual-Inductance Switching in 45-nm SOI CMOS", Feb. 2009, pp. 436-449, IEEE Journal of Solid- State Circuits, vol. 44, No. 2.
Safarian, et al., "Wideband Multi-Mode CMOS VCO Design Using Coupled Inductors", IEEE Transactions on Circuits and Systems-I: Regular Papers, Aug. 2009, pp. 1830-1843, vol. 56, No. 8.
Steinkamp, et al., "A Multi-Mode Wide-Bank 130nm CMOS VCO for WLAN and GSM/UMTS", Nov. 30-Dec. 2, 2005, pp. 105-108, IEEE International Workshop on Radio-Frequency Integration Technology, Singapore.

(Continued)

*Primary Examiner* — Ryan Johnson
(74) *Attorney, Agent, or Firm* — Kenyon S. Jenckes

(57) ABSTRACT

A tunable inductor circuit is disclosed. The tunable inductor circuit includes a first inductor. The tunable inductor circuit also includes a second inductor in parallel with the first inductor. The tunable inductor circuit also includes a switch coupled to the second inductor. A resistance of the switch is added in parallel to the first inductor based on operation of the switch.

30 Claims, 8 Drawing Sheets

(56) References Cited

OTHER PUBLICATIONS

Straayer, et al., "A Low-Noise Transformer-Based 1.7 GHz CMOS VCO", Feb. 2002, ISSCC 2002, Session 17, Advanced RF Techniques, 17.1, EECS Department, University of Michigan, Ann Arbor, Michigan, USA, Department of Electronica (SIC), University of Barcelona, Spain.

Yim, et al., "Switched Resonators and Their Applications in a Dual-Band Monolithic CMOS LC-Tuned VCO", Jan. 2006, pp. 74-81, IEEE Transactions on Microwave Theory and Techniques, vol. 54, No. 1.

International Search Report and Written Opinion—PCT/US2012/068038—ISA/EPO—Mar. 14, 2013.

Kim C.S., et al., "Variable Inductance Multilayer Inductor With MOSFET Switch Control", IEEE Electron Device Letters, IEEE Service Center, New York, NY, US; vol. 25, No. 3, Mar. 1, 2004, pp. 144-146, XP011108475, ISSN: 0741-3106, DOI: 10.1109/LED.2003.822670.

* cited by examiner

US 8,742,859 B2

TUNABLE INDUCTOR CIRCUIT

TECHNICAL FIELD

The present disclosure relates generally to communication systems. More specifically, the present disclosure relates to a tunable inductor circuit.

BACKGROUND

Electronic devices (cellular telephones, wireless modems, computers, digital music players, Global Positioning System units, Personal Digital Assistants, gaming devices, etc.) have become a part of everyday life. Small computing devices are now placed in everything from automobiles to housing locks. The complexity of electronic devices has increased dramatically in the last few years. For example, many electronic devices have one or more processors that help control the device, as well as a number of digital circuits to support the processor and other parts of the device.

Wireless communication systems are widely deployed to provide various types of communication content such as voice, video, data and so on. These systems may be multiple-access systems capable of supporting simultaneous communication of multiple wireless communication devices with one or more base stations.

Mobile devices may include a variety of circuits used during operation. For example, an oscillator may be used to synchronize various circuits across a board or integrated circuit within a mobile device. Furthermore, different circuits within a mobile device may operate using different frequencies. Therefore, mobile devices may generate multiple reference signals for different purposes.

Voltage controlled oscillators may be used in frequency synthesizer circuits to produce a voltage with a frequency based on an input signal. An inductor-capacitor (LC) circuit may be used in a voltage controlled oscillator. Therefore, benefits may be realized by a tunable inductor circuit.

SUMMARY OF THE INVENTION

A tunable inductor circuit is disclosed. The tunable inductor circuit includes a first inductor. The tunable inductor circuit also includes a second inductor in parallel with the first inductor. The tunable inductor circuit also includes a switch coupled to the second inductor. A resistance of the switch is added in parallel to the first inductor based on operation of the switch.

The tunable inductor circuit may also include a capacitor in parallel with the first inductor and the second inductor. The capacitor may be a capacitor bank that produces a plurality of possible capacitances. An inductance of the second inductor may be included in the tunable inductor circuit when the switch is on. The resistance of the switch may be added in parallel to the first inductor when the switch is on. The inductance of the second inductor may not be included in the tunable inductor circuit when the switch is off. The inductance of the tunable inductor may resonate with the capacitance of the capacitor to create an output signal with a target frequency. The switch may be an n-type metal-oxide-semiconductor (NMOS) field effect transistor or a p-type metal-oxide-semiconductor (PMOS) field effect transistor.

In one configuration, the tunable inductor circuit is in a voltage controlled oscillator (VCO) core. The VCO core may include an inductor/capacitor (LC) tank that generates a desired frequency using the tunable inductor circuit and the capacitor. The VCO core may also include a first n-type metal-oxide-semiconductor (NMOS) field effect transistor with a source connected to ground, a drain connected to a first VCO core output and a gate connected to a second VCO core output. The VCO core may also include a second NMOS field effect transistor with a source connected to ground, a drain connected to the second VCO core output and a gate connected to the first VCO core output. The VCO core may also include a first p-type metal-oxide-semiconductor (PMOS) field effect transistor with a source connected to a voltage supply, a drain connected to the first VCO core output and a gate connected to the second VCO core output. The VCO core may also include a second PMOS field effect transistor with a source connected to the voltage supply, a drain connected to the second VCO core output and a gate connected to the first VCO core output.

The VCO core may be coupled to a buffer with a first portion and a second portion. The first portion may include a first capacitance connected to the second VCO core output and a gate of a third p-type metal-oxide-semiconductor (PMOS) field effect transistor. The first portion may also include the third PMOS field effect transistor with a source connected to the voltage supply and a drain connected to the first portion output. The first portion may also include a second capacitance connected to the second VCO core output and a gate of a third n-type metal-oxide-semiconductor (NMOS) field effect transistor. The first portion may also include the third NMOS field effect transistor with a source connected to ground and a drain connected to the first portion output. The second portion may include a third capacitance connected to the first VCO core output and a gate of a fourth p-type metal-oxide-semiconductor (PMOS) field effect transistor. The second portion may also include the fourth PMOS field effect transistor with a source connected to the voltage supply and a drain connected to the second portion output. The second portion may also include a fourth capacitance connected to the first VCO core output and a gate of a fourth n-type metal-oxide-semiconductor (NMOS) field effect transistor. The second portion may also include the fourth NMOS field effect transistor with a source connected to ground and a drain connected to the second portion output. One or more of the first capacitance, second capacitance, third capacitance and fourth capacitance may be generated using the capacitor bank.

The tunable inductor circuit may also include a third inductor in parallel with the first inductor and the second inductor. The tunable inductor circuit may also include a second switch connected to the third inductor where the resistance of the second switch is added in parallel to the first inductor based on operation of the second switch.

A integrated circuit is disclosed. The integrated circuit includes a first inductor. The integrated circuit also includes a second inductor in parallel with the first inductor. The integrated circuit also includes a switch coupled to the second inductor. A resistance of the switch is added in parallel to the first inductor based on operation of the switch.

A method for tuning a tunable inductor circuit is also disclosed. A first inductor is provided. A second inductor in parallel with the first inductor is also provided. A switch that is coupled to the second inductor is also provided. A resistance of the switch is added in parallel to the first inductor based on operation of the switch.

A tunable inductor circuit is also disclosed. The tunable inductor circuit includes means for providing a first inductor. The tunable inductor circuit also includes means for providing a second inductor in parallel with the first inductor. The tunable inductor circuit also includes means for switching coupled to the second inductor. The resistance of the means for switching is added in parallel to the first inductor based on operation of the means for switching.

DETAILED DESCRIPTION

A phase locked loop (PLL) may be used to generate oscillating signals that are locked, relative to an input reference clock, in phase, frequency or both. This may include using a voltage controlled oscillator (VCO) (or a digitally controlled oscillator (DCO)) to produce an output signal with a frequency based on a VCO input signal. Some VCO designs may use a relatively large tuning range that is difficult to achieve by a single inductor. Therefore, the present systems and methods may use multiple inductors to achieve a relatively large tuning range. Specifically, a tunable inductor may include a first inductor in parallel with a second inductor that is switched. The second, switched inductor may be configured so that the switch resistance is in parallel with the first inductor when the switch is turned on, thus maintaining the quality factor (Q) of the tunable inductor while still achieving a relatively large tuning range. Therefore, the tunable inductor of the present systems and methods may achieve a high tuning range (i.e., high tunability) without sacrificing much of the quality factor (Q). Although discussed in context of a voltage controlled oscillator (VCO), the tunable inductor may be used in any circuit that uses inductors.

Figure 1:
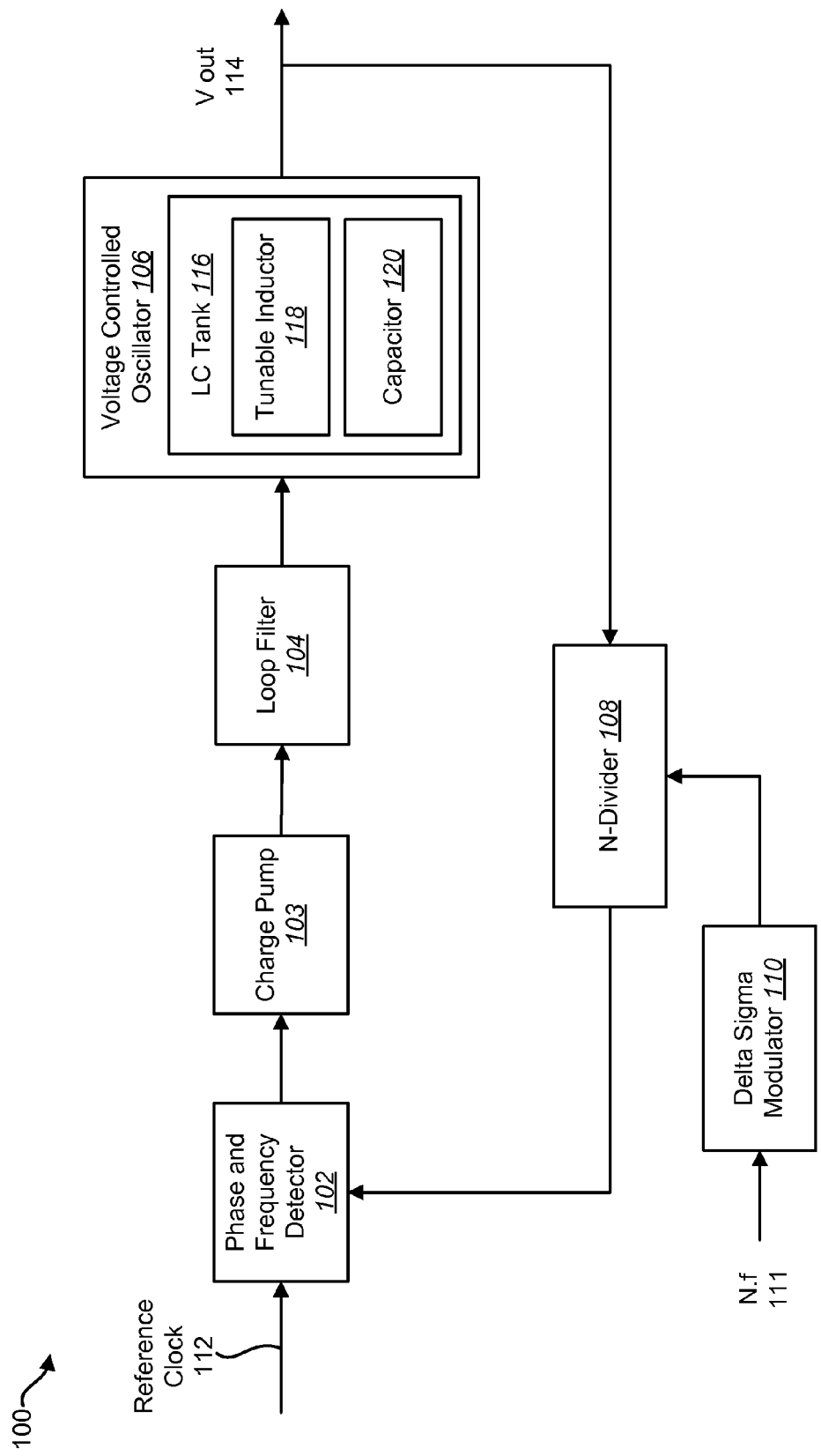
FIG. 1 is a block diagram illustrating a phase locked loop (PLL) that may implement the present systems and methods.

FIG. 1 is a block diagram illustrating a phase locked loop (PLL) 100 that may implement the present systems and methods. The PLL 100 may be implemented on a single integrated circuit and may include various modules in a feedback configuration. Specifically, the PLL 100 may implement a frequency synthesizer that is capable of generating a range of frequencies from a single fixed reference clock 112, e.g., an oscillator.

In one configuration, a reference clock 112 with a predetermined frequency may be provided by a crystal oscillator and/or another suitable signal generator, from which the PLL 100 may generate an output signal, Vout 114, that is fixed (i.e., locked) in frequency and/or phase to the reference clock 112. The PLL 100 may also include a phase and frequency detector (PFD) 102, a charge pump 103, a loop filter 104 and one or more voltage controlled oscillators (VCOs) 106 operating in a closed feedback loop. Optionally, the frequency synthesizer may also include an r-divider (not shown) that may alter the reference clock 112 prior to comparison at the PFD 102, e.g., divide the frequency of the reference clock 112.

The PFD 102 may compare the reference clock 112 to the output of an N-divider 108 in the feedback loop. The output of the N-divider 108 may be a signal with a frequency equal to the frequency of the output signal, Vout 114, divided by an integer parameter N. In one configuration, the PLL 100 may include an optional delta sigma modulator (DSM) 110. The DSM 110 may provide one of two integer values (N, N+1) to the N-divider 108 to achieve a fractional average divide ratio (N.f) 111 over time. In other words, the DSM 110 may vary the percentage of time the N-divider 108 spends using each instantaneous integer divide ratio so that the frequency of the VCO output (Vout) 114 may be selected with relatively high granularity. For example, if Fref is the frequency of the reference clock 112 and N.f is the desired time-average fractional divide ratio (N.f) 111, the frequency (Fvco) of the VCO output (Vout) 114 may settle at Fvco=Fref*N.f. Furthermore, the DSM 110 may randomize the selection of each integer divide factor while maintaining a desired time-average fractional divide ratio (N.f) 111. This may reduce spurious signals in the VCO output (Vout) 114 caused by a periodic switching between two instantaneous integer divide ratios.

The PFD 102 may determine any differences in phase and/or frequency between the output of the N-divider 108 and the reference clock 112 and express this difference as "pump up" or "pump down" pulses to the charge pump 103. For example, the PFD 102 may generate a digital output signal consisting of high and/or low pulses of varying lengths. The charge pump 103 may receive this signal and produce an output corresponding to the pump up and/or pump down signals from the PFD 102. The charge pump 103 output may subsequently be filtered by the loop filter 104 to provide a stable voltage level to the VCO(s) 106.

It may be desirable for the VCO 106 to have a wide tuning range. The tuning range may be a function of the range for inductance values and capacitance values created in the inductor-capacitor (LC) tank 116. Therefore, one possible way to increase the tuning range is to include a tunable capacitor 120 that is capable of creating a wide range of capacitance values, i.e., a capacitor bank. However, this may increase fabrication area for the LC tank 116.

Another possible way to increase the tuning range of the VCO 106 may be to use a tunable inductor 118. A tunable inductor 118 may be used with a tunable capacitor 120 (i.e., a capacitor bank capable of creating different capacitance values) or a fixed capacitor 120. A tunable inductor 118 may further increase the tuning range of the LC tank 116, i.e., enable continuous tuning from a wider range of frequencies.

Figure 2:
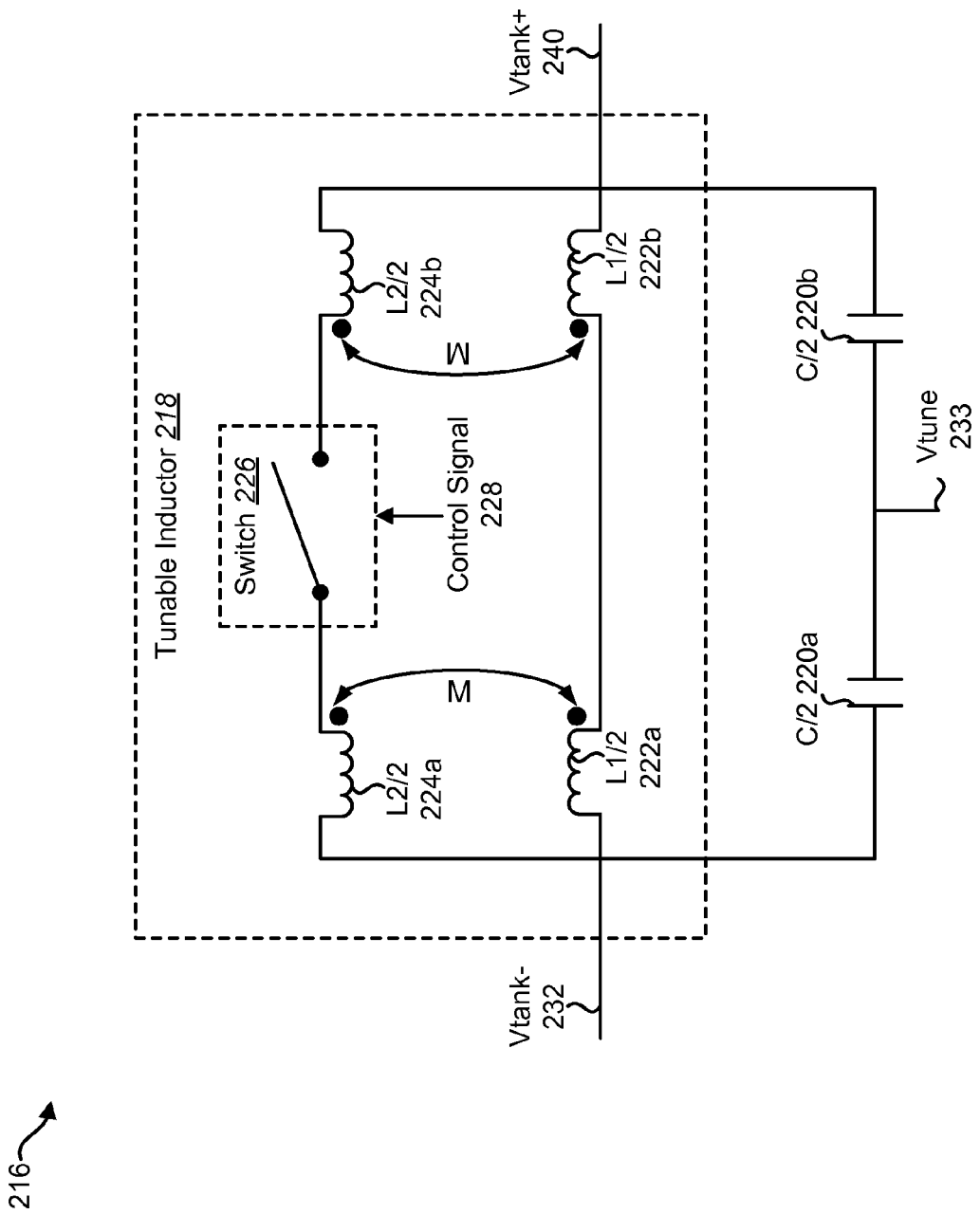
FIG. 2 is a circuit diagram illustrating an inductor-capacitor (LC) tank.

FIG. 2 is a circuit diagram illustrating an inductor-capacitor (LC) tank 216. The LC tank 216 may include a tunable inductor 218 in parallel with a capacitor (C) 220a-b. Alternatively, the capacitor (C) 220a-b may be a capacitor bank that can produce a range of capacitance values. The tunable inductor 218 may include a first inductor (L1) 222a-b in parallel with a second inductor (L2) 224a-b. When a switch 226 is off/open, the inductance of the tunable inductor 218 may be equal to the inductance of the first inductor (L1) 222a-b, i.e., the second inductor (L2) 224a-b is excluded. When the switch 226 is on/closed, the first inductor (L1) 222a-b may be in parallel with the second inductor (L2) 224a-b plus a coupling term (M/2), i.e., the coupling term is reduced to M/2 because the first inductor (L1) 222a-b and the second inductor (L2) 224a-b are in parallel. If the LC tank 216 is part of a VCO core, the outputs of the LC tank 216, Vtank− 232 and Vtank+ 240, may be taken at opposite ends of the LC tank 216 and fed into a VCO buffer (not shown). Furthermore, if the LC tank 216 is part of a VCO core, the tuning voltage (Vtune) 233 may be received in between a first capacitor portion (C/2) 220a and a second capacitor portion (C/2) 220b.

While the first inductor 222a-b is illustrated as two distinct elements, it may be implemented with a single inductor. Similarly, while the second inductor (L2) 224a-b is illustrated with two distinct elements, the separate elements may be two halves of the same inductor 224a-b. For example, in an integrated circuit, the second inductor (L2) 224a-b may be implemented with a loop that has a switch 226 in the middle of it. The switch 226 may receive a control signal 228 to turn it on or off. When on, the switch 226 may include the inductance of the second inductor (L2) 224a-b in the LC tank 216. When off, the switch 226 may act as an open circuit, thus excluding the inductance of the second inductor (L2) 224a-b in the LC tank 216. The switch 226 may be an n-type metal-oxide-semiconductor (NMOS) field effect transistor or a p-type metal-oxide-semiconductor (PMOS) field effect transistor.

One possible configuration (not shown) of a tunable inductor includes a first inductor in series with a second inductor, i.e., this configuration is referred to as a "series configuration" herein. In a series configuration, where the second inductor is switched (i.e., a switch is in parallel with the second inductor) so that the second inductor may be shorted or included to affect the tuning range. However, in a series configuration, the resistance of the switch is added in series to the first inductor when excluding the second inductor, i.e., when the switch is turned on to short the second inductor. This may increase tunability, but reduce the quality factor of the tunable inductor, i.e., the switch on resistance is added in series to the first inductor, which reduces the quality factor (Q) of the circuit.

In contrast to a series configuration, the tunable inductor 218 of the present systems and methods may include a first inductor (L1) 222a-b in parallel with a second inductor (L2) 224a-b, i.e., this configuration is referred to as a "parallel configuration" herein. The second inductor (L2) 224a-b may be switched, e.g., a switch 226 may be placed in the middle of a loop in an integrated circuit. By placing the second inductor (L2) 224a-b in parallel with the first inductor (L1) 222a-b, the switch 226 resistance is in parallel with the first inductor (L1) 222a-b when excluding the second inductor (L2) 224a-b, i.e., when the switch is off to create an open circuit. Therefore, the switch 226 resistance is in parallel with the first inductor (L1) 222a-b in the parallel configuration as opposed to in series in the series configuration (not shown).

By adding less unwanted resistance to the circuit, the parallel configuration of the tunable inductor 218 may maintain the quality factor (Q) of the LC tank 216 better than the series configuration. The quality factor (Q) may directly affect the current consumption of a circuit. Therefore, maintaining a high quality factor (Q) may reduce power consumption and reduce phase noise.

Although the tunable inductor 218 illustrated in FIG. 2 is shown with a first inductor (L1) 222a-b in parallel with a second inductor (L2) 224a-b, the tunable inductor 218 may include additional inductors (not shown) that are in parallel with the first inductor (L1) 222a-b and the second inductor (L2) 224a-b. Each of the additional inductors (not shown) may be switched, e.g., a switch may be placed in the middle of a loop in an integrated circuit. In other words, the tunable inductor 218 may include multiple switched inductors that are in parallel. This may provide more tunability, i.e., this may create an inductor bank similar to a capacitor bank.

Figure 3:
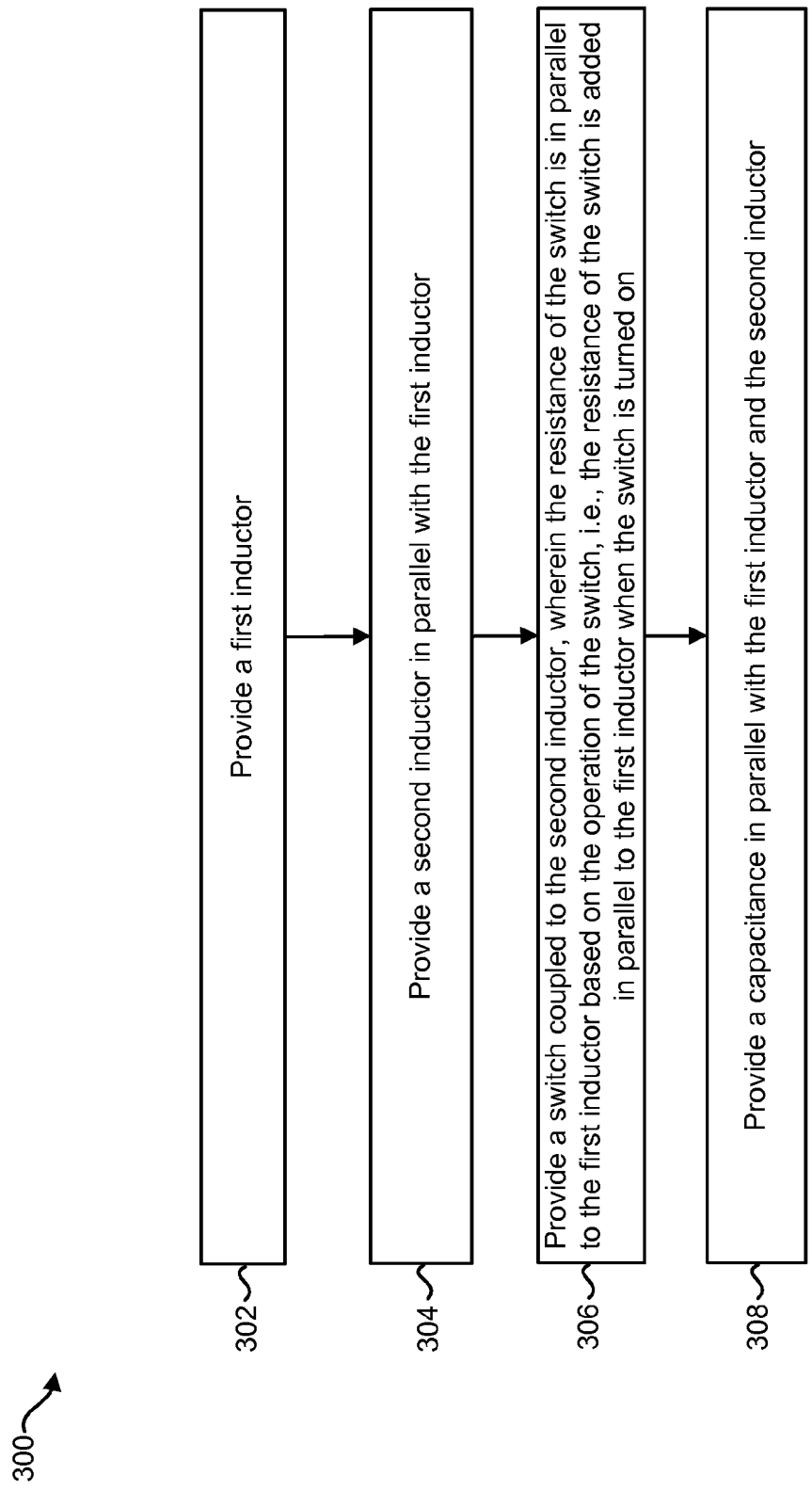
FIG. 3 is a flow diagram illustrating a method for tuning a tunable inductor circuit.

FIG. 3 is a flow diagram illustrating a method 300 for tuning a tunable inductor circuit 218. The method 300 may be performed inside an inductor-capacitor (LC) tank 216. The LC tank 216 may provide 302 a first inductor (L1) 222a-b. The LC tank 216 may also provide 304 a second inductor (L2) 224a-b. The LC tank 216 may also provide 306 a switch 226 coupled to the second inductor (L2) 224a-b where the resistance of the switch 226 is in parallel to the first inductor (L1) 222a-b based on the operation of the switch, i.e., the resistance of the switch 226 is in parallel with the first inductor (L1) 222a-b when the switch 226 is on. The switch 226, first inductor (L1) 222a-b and second inductor (L2) 224a-b may combine to form the tunable inductor 218. When the switch 226 is on, the inductance of the second inductor (L2) 224a-b may be included in the tunable inductor 218. When the switch 226 is off, the inductance of the second inductor (L2) 224a-b may not be included in the tunable inductor 218. Therefore, the switch 226 may be operated (i.e., using a control signal 228) to produce a desired inductance for the tunable circuit 218. The LC tank 216 may also provide 308 a capacitance (C) 220a-b in parallel with the first inductor (L1) 222a-b and the second inductor (L2) 224a-b. The inductance of the tunable inductor 218 (that depends on the operation of the switch 226) may resonate with the parallel capacitance at a target frequency. The capacitance may be created by a fixed capacitor or a capacitor bank that is capable of switching multiple capacitors in and out of the LC tank 216 to produce a particular capacitance.

The LC tank 216 may be included in a VCO 106. In a VCO 106, the LC tank 216 may resonate at a target frequency using the inductance in parallel with the capacitance. In other words, the switch 226 may be operated and the capacitor bank (C) 220a-b may be configured to produce a desired inductance and capacitance, respectively, that resonate at a target frequency.

Figure 4:
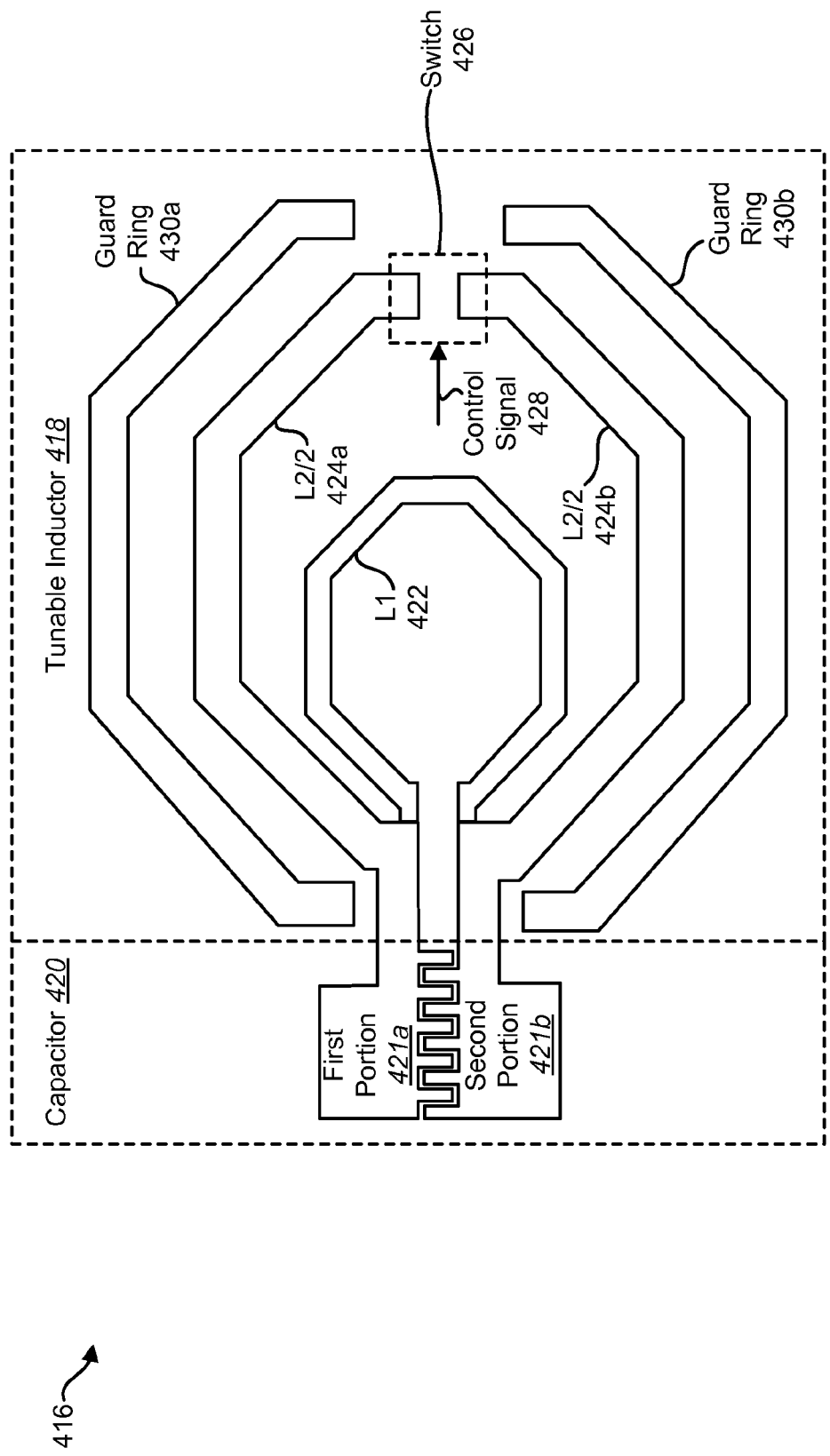
FIG. 4 illustrates one layout example of an inductor-capacitor (LC) tank.

FIG. 4 illustrates one layout example of an inductor-capacitor (LC) tank 416. The LC tank 416 may include a tunable inductor 418 in parallel with a capacitor 420. The capacitor 420 may be a tunable capacitor, i.e., a capacitor bank capable of producing multiple different capacitance values. The tunable inductor 418 may include a first inductor (L1) 422 in parallel with a second inductor (L2) 424a-b that is switchable. In a physical layout (e.g., fabricated on a silicon substrate), the first inductor (L1) 422 may be a loop inside of a second loop that implements the second inductor (L2) 424a-b. No extra area may be used by an additional inductor because the first inductor (L1) 422 is inside of the second inductor (L2) 424a-b. Furthermore, both inductors (L1, L2) 422, 424a-b may share the same set of tuning capacitors 420, thus simplifying the layout. The second inductor (L2) 424a-b may include a first portion (L2/2) 424a and a second portion (L2/2) 424b that are separated by a switch 426, i.e., the switch is in series with the first portion (L2/2) 424a and second portion (L2/2) 424b, but the second inductor (L2) 424a-b as a whole is in parallel with the first inductor (L1) 422.

The tunable inductor 418 may be a parallel configuration because the resistance of the switch 426 may be in parallel with the first inductor (L1) 422 when the switch 426 is turned on. Therefore, the parallel configuration tunable inductor 418 illustrated in FIG. 4 may maintain a higher quality factor than a series configuration (not shown) because the parallel configuration may have lower loss from the switch 426 compared to a series configuration. When the switch is turned on, the first inductor (L1) 422 may be in parallel with the second inductor (L2) 424a-b. When the switch 426 is turned off, the inductance of the tunable inductor 418 may be equal to the first inductor (L1) 422 alone. In this way, the tunable inductor 418 can produce different inductances while maintaining a relatively high quality factor. The switch 426 may operate based on a control signal 428 and may be an n-type metal-oxide-semiconductor (NMOS) field effect transistor or a p-type metal-oxide-semiconductor (PMOS) field effect transistor. The tunable inductor 418 may also include a guard ring 430a-b that electrically isolates the switchable inductor 418.

In addition to the tunable inductor 418, the LC tank 416 may also include a capacitor 420. The capacitor 420 may be in parallel with the first inductor (L1) 422 and the second inductor (L2) 424a-b. The capacitor 420 and tunable inductor 418 may resonate to produce a frequency based on the capacitance and inductance values produced by the capacitor 420 and tunable inductor 418, respectively. In one configuration, the capacitor 420 may include two non-electrically coupled metallic portions, where each portion may include fingers that extend perpendicular to their respective portions, but parallel to each other. In other words, the fingers for the first portion 421a (i.e., the fingers electrically coupled to the first portion 421a) may have a longer dimension extending perpendicular from the first portion 421a than in parallel with the first portion 421a. Likewise, the fingers for the second portion 421b (i.e., the fingers electrically coupled to the second portion 421b) may have a longer dimension extending perpendicular from the second portion 421b than in parallel with the second portion 421b. The fingers for the first portion 421a may be parallel and interlocking with the fingers for the second portion 421b without being coupled to the fingers for the second portion 421b.

Figure 5:
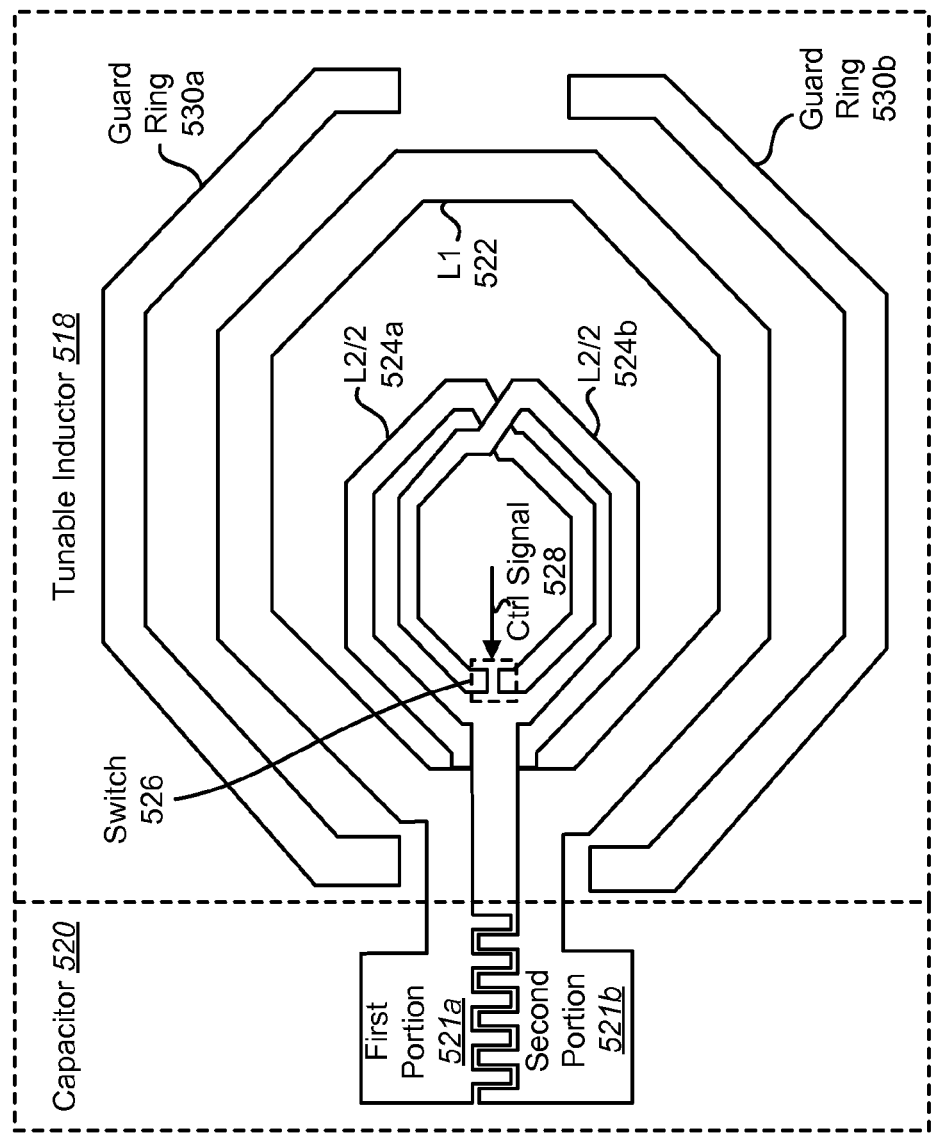
FIG. 5 illustrates another layout example of an inductor-capacitor (LC) tank.

FIG. 5 illustrates another layout example of an inductor-capacitor (LC) tank 516. Like before, the LC tank 516 may include a tunable inductor 518 in parallel with a capacitor 520. The capacitor 520 may be a tunable capacitor, i.e., a capacitor bank capable of producing multiple different capacitance values. The tunable inductor 518 may include a first inductor (L1) 522 in parallel with a second inductor (L2) 524a-b that is switchable. In this configuration, however, the first inductor (L1) 522 may be a loop outside of a second loop that implements the second inductor (L2) 524a-b. The second inductor (L2) 524a-b may be a continuous two-turn loop when the switch 526 is turned on. When the switch 526 is turned off, the second inductor (L2) 524a-b may include a first portion (L2/2) 524a not directly connected to a second portion (L2/2) 524b, i.e., an open circuit.

The tunable inductor 518 may be a parallel configuration because the resistance of the switch 526 may be in parallel with the first inductor (L1) 522 when the switch 526 is turned on. Therefore, the parallel configuration tunable inductor 518 illustrated in FIG. 5 may maintain a higher quality factor than a series configuration (not shown). When the switch 526 is turned on, the first inductor (L1) 522 may be in parallel with the second inductor (L2) 524a-b. In this way, the tunable inductor 518 may produce different inductances while maintaining a relatively high quality factor (Q). The switch 526 may operate based on a control signal 528 and may be an n-type metal-oxide-semiconductor (NMOS) field effect transistor or a p-type metal-oxide-semiconductor (PMOS) field effect transistor. The tunable inductor 518 may also include a guard ring 530a-b that electrically isolates the switchable inductor 518.

When compared to the tunable inductor 418 illustrated in FIG. 4, the tunable inductor 518 in FIG. 5 may have a higher tuning range (i.e., higher tunability), but a lower quality factor (Q). This is because the two-turn second inductor (L2) 524a-b may be physically smaller than the first inductor (L1) 422 illustrated in FIG. 4, which reduces the coupling between the first inductor (L1) 522 and the second inductor (L2) 524a-b. A smaller inductive coupling may allow for higher tunability.

In contrast, the tunable inductor 418 in FIG. 4 may have a lower tuning range, but maintain a higher quality factor (Q). Therefore, there may be a tradeoff between tunability and maintaining a higher quality factor (Q). The tunable inductor 418, 518 chosen may depend on the particular application.

For example, Table 1 illustrates possible tunability and quality factors (Qs) for the switched inductor 418 illustrated in FIG. 4 and the switched inductor 518 illustrated in FIG. 5, measured at a 4 GHz operating frequency:

TABLE 1

| | Tunability | Inductance (nH)-switch off | Quality Factor-switch off | Inductance (nH)-switch on | Quality Factor-switch on |
|---|---|---|---|---|---|
| FIG. 4 | 1.29:1 | 0.4 | 18.9 | 0.31 | 21.5 |
| FIG. 5 | 1.85:1 | 0.85 | 15.1 | 0.46 | 17.1 | where the switch loss is included in the quality factor (Q) numbers. The effective switch off capacitance may be Coff=0.5 pF and the switch on resistance may be Ron=1 Ohm for the configuration reflected in Table 1.

In one configuration, the capacitor 520 may include two non-electrically coupled metallic portions, where each portion may include fingers that extend perpendicular to their respective portions, but parallel to each other. In other words, the fingers for the first portion 521a (i.e., the fingers electrically coupled to the first portion 521a) may have a longer dimension extending perpendicular from the first portion 521a than in parallel with the first portion 521a. Likewise, the fingers for the second portion 521b (i.e., the fingers electrically coupled to the second portion 521b) may have a longer dimension extending perpendicular from the second portion 521b than in parallel with the second portion 521b. The fingers for the first portion 521a may be parallel and interlocking with the fingers for the second portion 521b without being coupled to the fingers for the second portion 521b.

Figure 6:
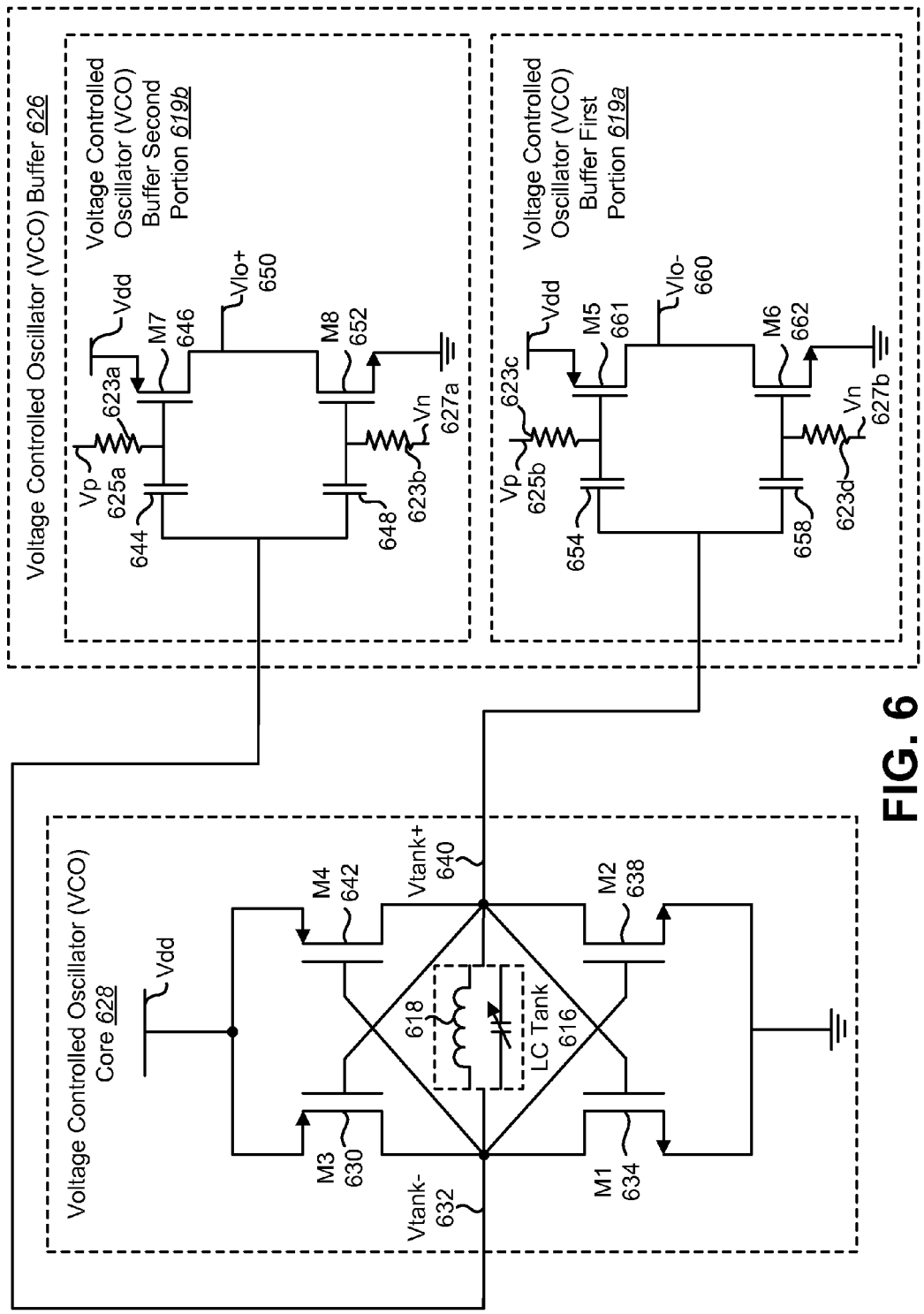
FIG. 6 is a circuit diagram illustrating a voltage controlled oscillator (VCO) core and a voltage controlled oscillator (VCO) buffer.

FIG. 6 is a circuit diagram illustrating a voltage controlled oscillator (VCO) core 628 and a voltage controlled oscillator (VCO) buffer 626. The VCO core 628 may include an inductor-capacitor (LC) tank 616. The LC tank 616 of FIG. 6 may be the LC tank 516 illustrated in FIG. 5, i.e., the LC tank 616 may include a tunable inductor 618. The VCO core 628 may include a first n-type metal-oxide-semiconductor (NMOS) field effect transistor M1 634 with the source of M1 634 connected to ground and the drain of M1 634 connected to an output Vtank− 632 of the VCO core 628. The gate of M1 634 may be connected to an output Vtank+ 640 of the VCO core 628. The VCO core 628 may include a second NMOS transistor M2 638, with the source of M2 638 connected to ground and the drain of M2 638 connected to the output Vtank+ 640. The gate of M2 638 may be connected to the output Vtank− 632.

The VCO core 628 may also include a first p-type metal-oxide-semiconductor (PMOS) field effect transistor M3 630 with the source of M3 630 connected to the positive rail Vdd and the drain of M3 630 connected to the output Vtank− 632 of the VCO core 628. The gate of M3 630 may be connected to the output Vtank+ 640. The VCO core 628 may further include a second PMOS transistor M4 642, with the source of M4 642 connected to Vdd, the drain of M4 642 connected to the output Vtank+ 640 and the gate of M4 642 connected to the output Vtank− 632. The LC tank 616 may connect Vtank+ 640 and Vtank− 632. The inductor 618 in the LC tank 616 may be a switched inductor 618 that resonates with a capacitance (e.g., a capacitor bank) to generate an oscillating signal.

The outputs of the VCO core 628 may be input into a VCO buffer 626. The VCO buffer 626 may include a VCO buffer first portion 619a that receives Vtank+ 640 from the VCO core 628 and a VCO buffer second portion 619b that receives Vtank− 632 from the VCO core 628.

The VCO buffer first portion 619a receiving Vtank+ 640 may include a first capacitor 654 and a second capacitor 658; each capacitor is connected to Vtank+ 640. The node on the other side of the first capacitor 654 may include a resistor 623c connecting the node to the direct current (DC) bias voltage Vp 625b of a PMOS transistor M5 661. The node may also be connected to the gate of the PMOS transistor M5 661. Similarly, the node on the other side of the second capacitor 658 may include a resistor 623d connecting the node to the DC bias voltage Vn 627b of an NMOS transistor M6 662. The node may also be connected to the gate of the NMOS transistor M6 662. The source of M6 662 may be connected to ground and the drain of M6 662 may be connected to an output Vlo− 660 of the VCO buffer 626. The source of M5 661 may be connected to Vdd and the drain of M5 661 may be connected to the output Vlo− 660.

The VCO buffer second portion 619b receiving Vtank− 632 may include a third capacitor 644 and a fourth capacitor 648, where each capacitor is connected to Vtank− 632. In one configuration, the third capacitor 644 and/or the fourth capacitor 648 may be implemented with the switched capacitor 420 illustrated in FIG. 4 or a capacitance produced from the capacitor bank 520 illustrated in FIG. 5. The node on the other side of the third capacitor 644 may include a resistor 623a connecting the node to Vp 625a. The node may connect the third capacitor 644 to the gate of a PMOS transistor M7 646. Similarly, the node on the other side of the fourth capacitor 648 may include a resistor 623b connecting the node to Vn 627a. The node may also connect the fourth capacitor 648 to the gate of an NMOS transistor M8 652. The source of M8 652 may be connected to ground and the drain of M8 652 may be connected to an output Vlo+ 650 of the VCO buffer 626. The source of M7 646 may be connected to Vdd and the drain of M7 646 may be connected to the output Vlo+ 650. Vtank+ 640 and Vtank− 632 may have a 3 volt (V) differential peak waveform for meeting stringent phase noise specifications.

Figure 7:
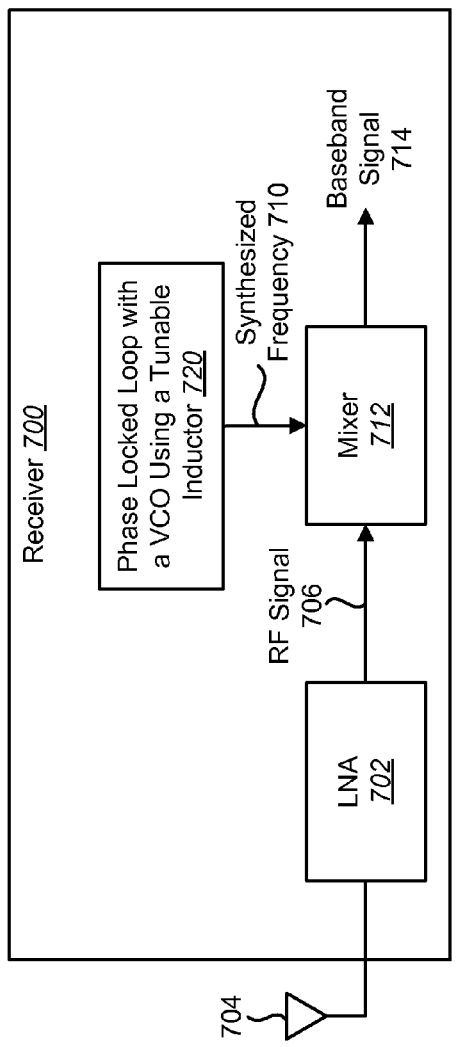
FIG. 7 is a block diagram illustrating a receiver.

FIG. 7 is a block diagram illustrating a receiver 700. The receiver 700 may be part of a mobile device or base station designed for wireless communication. The receiver 700 may include, among other things, a low noise amplifier (LNA) 702, a phase locked loop (PLL) with a VCO using a tunable inductor 720 and a mixer 712. The LNA 702 may receive a wireless communication signal from an antenna 704. The LNA 702 may amplify the received signal to usable levels and produce a radio frequency (RF) signal 706, i.e., a representation of the original signal sent. The PLL with a VCO using a tunable inductor 720 may output a synthesized frequency 710 directed to a particular application. The PLL with a VCO using a tunable inductor 720 may be capable of producing different frequencies. Although illustrated in the receiver 700, the PLL with a VCO using a tunable inductor 720 may be used in various applications in a mobile device or base station designed for wireless communication. The mixer 712 may receive the RF signal 706 from the LNA 702 and the synthesized frequency 710 from the PLL with a VCO using a tunable inductor 720 and produce a baseband signal 714. The baseband signal 714 may be the actual reconstructed audio received by a microphone on a transmitting device, e.g., voiced speech or other kinds of data. Thus, the receiver 700 may use the mixer 712 to reconstruct the baseband signal 714.

Figure 8:
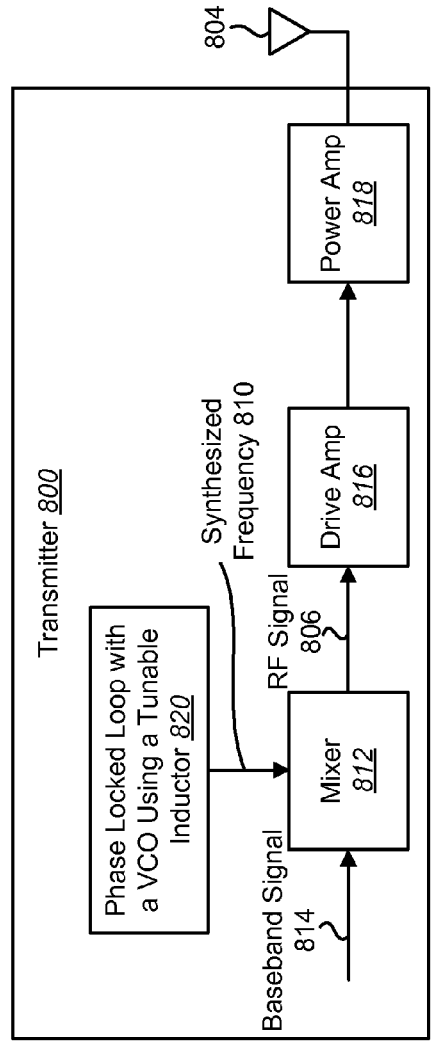
FIG. 8 is a block diagram illustrating a transmitter.

FIG. 8 is a block diagram illustrating a transmitter 800. The transmitter 800 may be part of a wireless device that may also include a receiver. The transmitter 800 may include, among other things, a PLL with a VCO using a tunable inductor 820, a mixer 812, a drive amplifier 816 and a power amplifier 818.

Like before, the PLL with a VCO using a tunable inductor 820 produce the synthesized frequency 810. The mixer 812 may receive the synthesized frequency 810 and a baseband signal 814 (e.g., voiced speech), and produce an RF signal 806. In other words, the transmitter 800 may use the mixer 812 to produce a modulated, high frequency RF signal 806 to be transmitted. Before the RF signal 806 is transmitted via an antenna 804, it may be amplified by a drive amplifier 816, a power amplifier 818 or both. Thus, the transmitter 800 may use the mixer 812 to construct an RF signal 806 for transmission.

Figure 9:
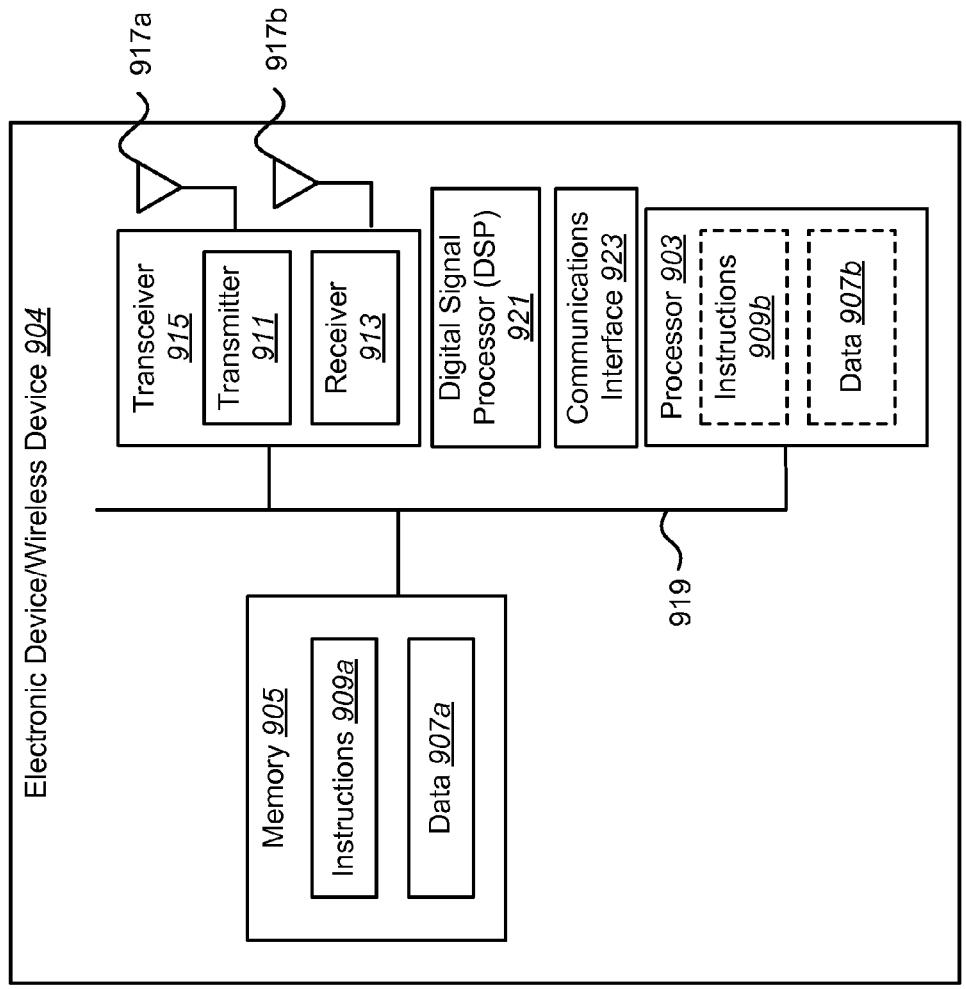
FIG. 9 illustrates certain components that may be included within an electronic device/wireless device.

FIG. 9 illustrates certain components that may be included within an electronic device/wireless device 904. The electronic device/wireless device 904 may be an access terminal, a mobile station, a user equipment (UE), a base station, an access point, a broadcast transmitter, a node B, an evolved node B, etc. For example, the electronic device/wireless device 904 may include the receiver 700 or transmitter 800 illustrated in FIGS. 7 and 8, respectively. The electronic device/wireless device 904 includes a processor 903. The processor 903 may be a general purpose single- or multi-chip microprocessor (e.g., an ARM), a special purpose microprocessor (e.g., a digital signal processor (DSP)), a microcontroller, a programmable gate array, etc. The processor 903 may be referred to as a central processing unit (CPU). Although just a single processor 903 is shown in the electronic device/wireless device 904 of FIG. 9, in an alternative configuration, a combination of processors (e.g., an ARM and DSP) could be used.

The electronic device/wireless device 904 also includes memory 905. The memory 905 may be any electronic component capable of storing electronic information. The memory 905 may be embodied as random access memory (RAM), read-only memory (ROM), magnetic disk storage media, optical storage media, flash memory devices in RAM, on-board memory included with the processor, EPROM memory, EEPROM memory, registers, and so forth, including combinations thereof.

Data 907a and instructions 909a may be stored in the memory 905. The instructions 909a may be executable by the processor 903 to implement the methods disclosed herein. Executing the instructions 909a may involve the use of the data 907a that is stored in the memory 905. When the processor 903 executes the instructions 909a, various portions of the instructions 909b may be loaded onto the processor 903, and various pieces of data 907b may be loaded onto the processor 903.

The electronic device/wireless device 904 may also include a transmitter 911 and a receiver 913 to allow transmission and reception of signals to and from the electronic device/wireless device 904. The transmitter 911 and receiver 913 may be collectively referred to as a transceiver 915. Multiple antennas 917a-b may be electrically coupled to the transceiver 915. The electronic device/wireless device 904 may also include (not shown) multiple transmitters, multiple receivers, multiple transceivers and/or additional antennas.

The electronic device/wireless device 904 may include a digital signal processor (DSP) 921. The electronic device/wireless device 904 may also include a communications interface 923. The communications interface 923 may allow a user to interact with the electronic device/wireless device 904.

The various components of the electronic device/wireless device 904 may be coupled together by one or more buses, which may include a power bus, a control signal bus, a status signal bus, a data bus, etc. For the sake of clarity, the various buses are illustrated in FIG. 9 as a bus system 919.

The term "coupled" encompasses a wide variety of connections. For example, the term "coupled" should be interpreted broadly to encompass circuit elements directly connected to each other and circuit elements indirectly connected via other circuit elements.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "processor" should be interpreted broadly to encompass a general purpose processor, a central processing unit (CPU), a microprocessor, a digital signal processor (DSP), a controller, a microcontroller, a state machine, and so forth. Under some circumstances, a "processor" may refer to an application specific integrated circuit (ASIC), a programmable logic device (PLD), a field programmable gate array (FPGA), etc. The term "processor" may refer to a combination of processing devices, e.g., a combination of a DSP and a microprocessor, a plurality of microprocessors, one or more microprocessors in conjunction with a DSP core, or any other such configuration.

The term "memory" should be interpreted broadly to encompass any electronic component capable of storing electronic information. The term memory may refer to various types of processor-readable media such as random access memory (RAM), read-only memory (ROM), non-volatile random access memory (NVRAM), programmable read-only memory (PROM), erasable programmable read only memory (EPROM), electrically erasable PROM (EEPROM), flash memory, magnetic or optical data storage, registers, etc. Memory is said to be in electronic communication with a processor if the processor can read information from and/or write information to the memory. Memory that is integral to a processor is in electronic communication with the processor.

The terms "instructions" and "code" should be interpreted broadly to include any type of computer-readable statement(s). For example, the terms "instructions" and "code" may refer to one or more programs, routines, sub-routines, functions, procedures, etc. "Instructions" and "code" may comprise a single computer-readable statement or many computer-readable statements.

The functions described herein may be implemented in software or firmware being executed by hardware. The functions may be stored as one or more instructions on a computer-readable medium. The terms "computer-readable medium" or "computer-program product" refers to any tangible storage medium that can be accessed by a computer or a processor. By way of example, and not limitation, a computer-readable medium may comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, includes compact disc (CD), laser disc, optical disc, digital versatile disc (DVD), floppy disk and Blu-ray® disc where disks usually reproduce data magnetically, while discs reproduce data optically with lasers.

The methods disclosed herein comprise one or more steps or actions for achieving the described method. The method steps and/or actions may be interchanged with one another without departing from the scope of the claims. In other words, unless a specific order of steps or actions is required for proper operation of the method that is being described, the order and/or use of specific steps and/or actions may be modified without departing from the scope of the claims.

Further, it should be appreciated that modules and/or other appropriate means for performing the methods and techniques described herein, such as those illustrated by FIG. 3, can be downloaded and/or otherwise obtained by a device. For example, a device may be coupled to a server to facilitate the transfer of means for performing the methods described herein. Alternatively, various methods described herein can be provided via a storage means (e.g., random access memory (RAM), read only memory (ROM), a physical storage medium such as a compact disc (CD) or floppy disk, etc.), such that a device may obtain the various methods upon coupling or providing the storage means to the device.

It is to be understood that the claims are not limited to the precise configuration and components illustrated above. Various modifications, changes and variations may be made in the arrangement, operation and details of the systems, methods, and apparatus described herein without departing from the scope of the claims.

What is claimed is:

1. A tunable inductor circuit, comprising:
   a first inductor;
   a second inductor that has two turns and is in parallel with the first inductor; and
   a switch coupled to the second inductor, wherein a resistance of the switch is added in parallel to the first inductor based on operation of the switch, wherein the switch is located along an inner loop of the second inductor;
   a capacitor in parallel with the first inductor and the second inductor, wherein the capacitor is fabricated with two non-touching metallic portions, wherein metallic fingers extend perpendicular to their respective metallic portions and parallel to other metallic fingers.

2. The tunable inductor circuit of claim 1, wherein the capacitor is a part of a capacitor bank that produces one of a plurality of possible capacitances.

3. The tunable inductor circuit of claim 2, wherein an inductance of the second inductor is included in the tunable inductor circuit when the switch is on and the resistance of the switch is added in parallel to the first inductor when the switch is on.

4. The tunable inductor circuit of claim 3, wherein the inductance of the second inductor is not included in the tunable inductor circuit when the switch is off.

5. The tunable inductor circuit of claim 4, wherein an inductance of the tunable inductor resonates with the capacitance of the capacitor to create an output signal with a target frequency.

6. The tunable inductor circuit of claim 1, wherein the switch is an n-type metal-oxide-semiconductor (NMOS) field effect transistor or a p-type metal-oxide-semiconductor (PMOS) field effect transistor.

7. The tunable inductor circuit of claim 1, wherein the tunable inductor circuit is in a voltage controlled oscillator (VCO) core, comprising:
   an inductor/capacitor (LC) tank that generates a desired frequency using the tunable inductor circuit and the capacitor; and
   a first n-type metal-oxide-semiconductor (NMOS) field effect transistor with a source connected to ground, a drain connected to a first VCO core output and a gate connected to a second VCO core output;
a second NMOS field effect transistor with a source connected to ground, a drain connected to the second VCO core output and a gate connected to the first VCO core output;
a first p-type metal-oxide-semiconductor (PMOS) field effect transistor with a source connected to a voltage supply, a drain connected to the first VCO core output and a gate connected to the second VCO core output; and
a second PMOS field effect transistor with a source connected to the voltage supply, a drain connected to the second VCO core output and a gate connected to the first VCO core output.

8. The tunable inductor circuit of claim 7, wherein the first VCO core output and the second VCO core output are coupled to a buffer, comprising:
a first portion, comprising:
a first capacitance connected to the second VCO core output and a gate of a third p-type metal-oxide-semiconductor (PMOS) field effect transistor;
the third PMOS field effect transistor with a source connected to the voltage supply and a drain connected to a first portion output;
a second capacitance connected to the second VCO core output and a gate of a third n-type metal-oxide-semiconductor (NMOS) field effect transistor;
the third NMOS field effect transistor with a source connected to ground and a drain connected to the first portion output; and
a second portion, comprising:
a third capacitance connected to the first VCO core output and a gate of a fourth p-type metal-oxide-semiconductor (PMOS) field effect transistor;
the fourth PMOS field effect transistor with a source connected to the voltage supply and a drain connected to a second portion output;
a fourth capacitance connected to the first VCO core output and a gate of a fourth n-type metal-oxide-semiconductor (NMOS) field effect transistor; and
the fourth NMOS field effect transistor with a source connected to ground and a drain connected to the second portion output.

9. The tunable inductor circuit of claim 1, further comprising:
a third inductor in parallel with the first inductor and the second inductor; and
a second switch connected to the third inductor, wherein a resistance of the second switch is added in parallel to the first inductor based on operation of the second switch.

10. An integrated circuit, comprising:
a first inductor;
a second inductor that has two turns and is in parallel with the first inductor; and
a switch coupled to the second inductor, wherein a resistance of the switch is added in parallel to the first inductor based on operation of the switch, wherein the switch is located along an inner loop of the second inductor;
a capacitor in parallel with the first inductor and the second inductor, wherein the capacitor is fabricated with two non-touching metallic portions, wherein metallic fingers extend perpendicular to their respective metallic portions and parallel to other metallic fingers.

11. The integrated circuit of claim 10, wherein the capacitor is a part of a capacitor bank that produces one of a plurality of possible capacitances.

12. The integrated circuit of claim 11, wherein an inductance of the second inductor is included in the integrated circuit when the switch is on and the resistance of the switch is added in parallel to the first inductor when the switch is on.

13. The integrated circuit of claim 12, wherein the inductance of the second inductor is not included in the integrated circuit when the switch is off.

14. The integrated circuit of claim 13, wherein an inductance of the integrated circuit resonates with the capacitance of the capacitor to create an output signal with a target frequency.

15. The integrated circuit of claim 10, wherein the switch is an n-type metal-oxide-semiconductor (NMOS) field effect transistor or a p-type metal-oxide-semiconductor (PMOS) field effect transistor.

16. The integrated circuit of claim 10, wherein the integrated circuit is in a voltage controlled oscillator (VCO) core, comprising:
an inductor/capacitor (LC) tank that generates a desired frequency using the integrated circuit and the capacitor; and
a first n-type metal-oxide-semiconductor (NMOS) field effect transistor with a source connected to ground, a drain connected to a first VCO core output and a gate connected to a second VCO core output;
a second NMOS field effect transistor with a source connected to ground, a drain connected to the second VCO core output and a gate connected to the first VCO core output;
a first p-type metal-oxide-semiconductor (PMOS) field effect transistor with a source connected to a voltage supply, a drain connected to the first VCO core output and a gate connected to the second VCO core output; and
a second PMOS field effect transistor with a source connected to the voltage supply, a drain connected to the second VCO core output and a gate connected to the first VCO core output.

17. The integrated circuit of claim 16, wherein the first VCO core output and the second VCO core output are coupled to a buffer, comprising:
a first portion, comprising:
a first capacitance connected to the second VCO core output and a gate of a third p-type metal-oxide-semiconductor (PMOS) field effect transistor;
the third PMOS field effect transistor with a source connected to the voltage supply and a drain connected to a first portion output;
a second capacitance connected to the second VCO core output and a gate of a third n-type metal-oxide-semiconductor (NMOS) field effect transistor;
the third NMOS field effect transistor with a source connected to ground and a drain connected to the first portion output; and
a second portion, comprising:
a third capacitance connected to the first VCO core output and a gate of a fourth p-type metal-oxide-semiconductor (PMOS) field effect transistor;
the fourth PMOS field effect transistor with a source connected to the voltage supply and a drain connected to a second portion output;
a fourth capacitance connected to the first VCO core output and a gate of a fourth n-type metal-oxide-semiconductor (NMOS) field effect transistor; and
the fourth NMOS field effect transistor with a source connected to ground and a drain connected to the second portion output.

18. A method for tuning a tunable inductor circuit, comprising:
providing a first inductor;
providing a second inductor that has two turns and is in parallel with the first inductor; and
providing a switch coupled to the second inductor, wherein a resistance of the switch is added in parallel to the first inductor based on operation of the switch, wherein the switch is located along an inner loop of the second inductor;
providing a capacitor in parallel with the first inductor and the second inductor, wherein the capacitor is fabricated with two non-touching metallic portions, wherein metallic fingers extend perpendicular to their respective metallic portions and parallel to other metallic fingers.

19. The method of claim 18, wherein the capacitor is a part of a capacitor bank that produces one of a plurality of possible capacitances.

20. The method of claim 19, further comprising operating the switch to include an inductance of the second inductor in the tunable inductor circuit when the switch is on and adding the resistance of the switch in parallel to the first inductor when the switch is on.

21. The method of claim 20, further comprising operating the switch to not include the inductance of the second inductor in the tunable inductor circuit when the switch is off.

22. The method of claim 18, wherein the switch is an n-type metal-oxide-semiconductor (NMOS) field effect transistor or a p-type metal-oxide-semiconductor (PMOS) field effect transistor.

23. The method of claim 18, wherein the tunable inductor circuit is in a voltage controlled oscillator (VCO) core, comprising:
an inductor/capacitor (LC) tank that generates a desired frequency using the tunable inductor circuit and the parallel capacitance; and
a first n-type metal-oxide-semiconductor (NMOS) field effect transistor with a source connected to ground, a drain connected to a first VCO core output and a gate connected to a second VCO core output;
a second NMOS field effect transistor with a source connected to ground, a drain connected to the second VCO core output and a gate connected to the first VCO core output;
a first p-type metal-oxide-semiconductor (PMOS) field effect transistor with a source connected to a voltage supply, a drain connected to the first VCO core output and a gate connected to the second VCO core output; and
a second PMOS field effect transistor with a source connected to the voltage supply, a drain connected to the second VCO core output and a gate connected to the first VCO core output.

24. The method of claim 23, wherein the first VCO core output and the second VCO core output are coupled to a buffer, comprising:
a first portion, comprising:
a first capacitance connected to the second VCO core output and a gate of a third p-type metal-oxide-semiconductor (PMOS) field effect transistor;
the third PMOS field effect transistor with a source connected to the voltage supply and a drain connected to a first portion output;
a second capacitance connected to the second VCO core output and a gate of a third n-type metal-oxide-semiconductor (NMOS) field effect transistor;
the third NMOS field effect transistor with a source connected to ground and a drain connected to the first portion output; and
a second portion, comprising:
a third capacitance connected to the first VCO core output and a gate of a fourth p-type metal-oxide-semiconductor (PMOS) field effect transistor;
the fourth PMOS field effect transistor with a source connected to the voltage supply and a drain connected to a second portion output;
a fourth capacitance connected to the first VCO core output and a gate of a fourth n-type metal-oxide-semiconductor (NMOS) field effect transistor; and
the fourth NMOS field effect transistor with a source connected to ground and a drain connected to the second portion output.

25. A tunable inductor circuit, comprising:
means for providing a first inductance;
means for providing a second inductance that has two loops and is in parallel with the first inductance; and
means for switching coupled to the means for providing a second inductance, wherein a resistance of the means for switching is added in parallel to the means for providing the first inductance based on operation of the means for switching, wherein the means for switching is located along an inner loop of the second inductor;
a capacitor in parallel with the first inductance and the second inductance, wherein the capacitor is fabricated with two non-touching metallic portions, wherein metallic fingers extend perpendicular to their respective metallic portions and parallel to other metallic fingers.

26. The tunable inductor circuit of claim 25, wherein the capacitor is a part of a capacitor bank that produces one of a plurality of possible capacitances.

27. The tunable inductor circuit of claim 26, further comprising means for operating the means for switching to include the second inductance in the tunable inductor circuit when the means for switching is on and adding the resistance of the means for switching in parallel to the first inductance when the means for switching is on.

28. The tunable inductor circuit of claim 27, further comprising means for operating the means for switching to not include the second inductance in the tunable inductor circuit when the means for switching is off.

29. The tunable inductor circuit of claim 25, wherein the tunable inductor circuit is in a voltage controlled oscillator (VCO) core, comprising:
an inductor/capacitor (LC) tank that generates a desired frequency using the tunable inductor circuit and the parallel capacitance; and
a first n-type metal-oxide-semiconductor (NMOS) field effect transistor with a source connected to ground, a drain connected to a first VCO core output and a gate connected to a second VCO core output;
a second NMOS field effect transistor with a source connected to ground, a drain connected to the second VCO core output and a gate connected to the first VCO core output;
a first p-type metal-oxide-semiconductor (PMOS) field effect transistor with a source connected to a voltage supply, a drain connected to the first VCO core output and a gate connected to the second VCO core output; and
a second PMOS field effect transistor with a source connected to the voltage supply, a drain connected to the second VCO core output and a gate connected to the first VCO core output.

30. The tunable inductor circuit of claim 29, wherein the first VCO core output and the second VCO core output are coupled to a buffer, comprising:
  a first portion, comprising:
    a first capacitance connected to the second VCO core output and a gate of a third p-type metal-oxide-semiconductor (PMOS) field effect transistor;
    the third PMOS field effect transistor with a source connected to the voltage supply and a drain connected to a first portion output;
    a second capacitance connected to the second VCO core output and a gate of a third n-type metal-oxide-semiconductor (NMOS) field effect transistor;
    the third NMOS field effect transistor with a source connected to ground and a drain connected to the first portion output; and
  a second portion, comprising:
    a third capacitance connected to the first VCO core output and a gate of a fourth p-type metal-oxide-semiconductor (PMOS) field effect transistor;
    the fourth PMOS field effect transistor with a source connected to the voltage supply and a drain connected to a second portion output;
    a fourth capacitance connected to the first VCO core output and a gate of a fourth n-type metal-oxide-semiconductor (NMOS) field effect transistor; and
    the fourth NMOS field effect transistor with a source connected to ground and a drain connected to the second portion output.

* * * * *